(12) United States Patent
Lill et al.

(10) Patent No.: US 6,228,208 B1
(45) Date of Patent: May 8, 2001

(54) PLASMA DENSITY AND ETCH RATE ENHANCING SEMICONDUCTOR PROCESSING CHAMBER

(75) Inventors: Thorsten Lill, Sunnyvale; Alan Ouye, San Mateo, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/133,279

(22) Filed: Aug. 12, 1998

(51) Int. Cl.[7] .................................................. C23F 1/02
(52) U.S. Cl. ................. 156/345; 118/723 R; 118/723 E; 118/715
(58) Field of Search ................. 118/715, 723 R, 118/723 E, 723 ER, 723 I, 723 IR, 723 AW, 723 MW, 504, 723 MR, 723 ME, 723 MA; 156/345

(56) References Cited

U.S. PATENT DOCUMENTS

| 5,215,619 | 6/1993 | Cheng et al. ........................ 156/345 |
| 5,225,024 | 7/1993 | Hanley et al. ........................ 156/345 |
| 5,728,253 | 3/1998 | Saito et al. ........................... 156/345 |
| 5,885,356 | * 3/1999 | Zhao et al. ...................... 118/723 ER |
| 5,891,350 | * 4/1999 | Shan et al. ............................... 216/71 |
| 5,950,925 | * 9/1999 | Fukunaga et al. ................. 239/132.3 |
| 5,964,947 | * 10/1999 | Zhao et al. ............................ 118/715 |
| 5,976,308 | * 11/1999 | Fairbain et al. ...................... 156/345 |
| 6,110,556 | * 8/2000 | Bang et al. .......................... 428/64.1 |

FOREIGN PATENT DOCUMENTS 0 714 998 A2   6/1996   (EP) .............................. C23C/16/44

* cited by examiner

*Primary Examiner*—Gregory Mills
*Assistant Examiner*—Luz Alejandro
(74) *Attorney, Agent, or Firm*—Thomason, Moser, and Patterson

(57) ABSTRACT

A lid assembly for a narrow-gap magnetically enhanced reactive ion etch (MERIE) chamber. The lid assembly has a lid and a liner. Both pieces are substantially U-shaped and interfit such that the interface between them extends outside the chamber. A blocker plate is situated in a recess between a lower surface of the lid and an upper surface of the liner. The blocker plate is concave in shape so that a downward bow of the lid does not exert a stress on the blocker plate. The novel lid assembly is more leak resistant, requires less cleaning time and is cheaper than a design that utilizes a moving pedestal.

18 Claims, 4 Drawing Sheets

US 6,228,208 B1

PLASMA DENSITY AND ETCH RATE ENHANCING SEMICONDUCTOR PROCESSING CHAMBER

BACKGROUND OF THE DISCLOSURE

1. Field of the Invention

The invention relates to semiconductor processing chambers and, more particularly, the invention relates to gas distribution plates for a narrow gap chamber for deep trench etch.

2. Description of the Background Art

Integrated circuit (IC) wafer processing systems, particularly those which fabricate VLSI circuits on silicon wafers, can use many processes to form the circuit features in a die on a wafer. One of the more popular processes is magnetically enhanced reactive ion etching (MERIE) where a highly reactive plasma is used to react with the material on the wafer surface or an underlying substrate though a series of photoresist masks to produce the desired circuit features. A rotating magnetic field, produced by magnets mounted outside the chamber stirs the plasma. MERIE processes and reactors are described in detail in U.S. Pat. No. 5,215,619, issued Jun. 1, 1993 and U.S. Pat. No. 5,225,024, issued Jul. 6, 1993, both of which are incorporated herein by reference. A typical MERIE chamber has a pedestal for supporting a wafer. The pedestal typically includes a cathode and a mechanical or electrostatic chuck. Reactive gas enters the chamber through an aluminum gas distribution plate disposed above the pedestal. Typically, the gas distribution plate is attached to the underside of an aluminum lid that closes the top of the chamber. The gas distribution plate also includes a plastic blocker plate that occupies most of the space between an interior surface of the gas distribution plate and a bottom surface of the lid.

When MERIE is used to etch deep trenches in the surface of a semiconductor wafer, a narrow gap between the cathode and the gas distribution plate is often desirable. In this way the plasma is confined to a small volume within the narrow gap thereby increasing the plasma density without increasing the plasma power. The higher plasma density is desirable in a deep trench etch because it leads to a higher etch rate.

Prior art MERIE chambers have attempted to narrow this gap by mechanically changing the height of the pedestal. Such a height adjustable pedestal is expensive and time consuming to manufacture. As an alternative, the chamber lid may be designed such that the lid is indented. A MERIE chamber of the prior art is depicted in FIG. 1. The chamber 100 has a set of walls 102 defining an internal volume. A wafer 104 (shown in phantom) rests on a pedestal 106 situated inside the chamber 100. Lift pins 108 raise and lower the wafer relative to the pedestal 106. The wafer 104 is introduced into the chamber 100 by a robot arm 110 (also shown in phantom). Plasma confining magnetic fields are produced by magnets 138 mounted outside the chamber.

The chamber 100 is covered by a lid assembly 112. The lid assembly 112 includes an indented lid 114 that projects into the chamber 100. The lid 114 has a radially projecting flange 117. The lid 114 is supported on the chamber walls 102 by the flange 117 and secured thereto by bolts 116. The lid 114 is typically sealed by an O-ring (not shown). The lid 114 has a lower surface 115 that is substantially flat. A gas distribution plate 118 is attached to the lower surface 115 of the lid 114 by a plurality of long bolts 128 that fit through a plurality of clearance holes 129 in the lid 114 and thread into a plurality of tapped holes 130 in an upper surface 119 of the gas distribution plate 118. The indentation of the lid produces a narrow gap between a bottom surface of the gas distribution plate and the pedestal 106 that confines a plasma to a small volume within the chamber 102.

A plastic blocker plate 120 fits in a recess 121 in the upper surface 119 of the gas distribution plate 118. Reactive gas is fed into the chamber 100 through a gas feed line 122 which communicates with a passage 124 in the lid 114 and a matching hole 123 in the blocker plate 120 into the recess 121. Gas enters the chamber through a plurality of orifices 126 in the gas distribution plate 118 that communicate between the recess 121 and the interior of the chamber 102. A large diameter O-ring 132 is located radially outward of the clearance holes 129. A small diameter O-ring 134, located radially inward of the clearance holes 129. As shown in FIG. 1B, the O-rings seal the gas distribution plate 118 when the chamber is at room temperature (approximately 20° C.). However, thermal stresses occur when the chamber is at its operating temperature of 70° C. to 90° C. These thermal stresses cause the lid 114 to bow downwardly at its center and upwardly at its rim as shown in FIG. 1C. As a result, a downward stress is applied to the blocker plate 120. The blocker plate 120, in turn, presses down on the gas distribution plate 118 exerting a stress that tends to cause first the inner O-ring 132 then the outer O-ring 134 to fail.

The lid 114 and the gas distribution plate 118 join at an interface 131 that terminates inside the chamber 100. A first vacuum leak path exists at the clearance holes 129, along the interface 131 past the large diameter O-ring 132. The interface 131 also communicates with the recess 121, therefore a second leak path exists through the clearance holes 129 along the interface 131 past the small diameter O-ring 134 into the recess 121 and thence through the orifices 126 into the chamber. As such the space in between the O-rings 132 and 134 is essentially at atmospheric pressure and, therefore, likely to leak into the chamber. Consequently, the chamber takes a long time to pump down. Residual moisture and gas adversely affect the result of a deep trench etch. If the chamber is not pumped down long enough to remove residual moisture and gas, contaminant particles (such as silicon oxide) can be formed on the wafer during processing rendering one or more dies on the wafer defective. Furthermore, each time the chamber is opened, both the lid 114 and the gas distribution plate 118 must be wet cleaned which delays wafer production.

Therefore, a need exists in the art for a lid assembly for a narrow gap MERIE reactor that remains sealed under operating conditions.

SUMMARY OF THE INVENTION

The disadvantages associated with the prior art are overcome with the present invention of a semiconductor processing chamber with an inventive lid assembly. Specifically, the lid assembly comprises an indented lid and a gas distribution plate disposed below the lid. An upper surface of the gas distribution plate substantially conforms to the shape of a lower surface of the lid such that an edge of a joint between them lies outside the chamber. Preferably, both the lid and the gas distribution plate are U-shaped in cross section. The lid has a recess in a lower surface thereof. The recess is sealed from the atmosphere by an O-ring, disposed between the gas distribution plate and lid, located radially outward of the recess. An inventive blocker plate is disposed within the recess for evenly distributing gas flow. The blocker plate conforms to the lower surface of the lid when the lid assembly is heated. Preferably, the blocker plate has a concave upper surface.

The novel shape of the gas distribution plate reduces leaks. The novel gas distribution plate is sealed with only a single O-ring thereby reducing complexity of construction and number of components that may fail. Furthermore, the concave blocker plate compensates for the thermal stress due to the bowing of the gas distribution plate which might otherwise cause the O-ring to fail.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1A:
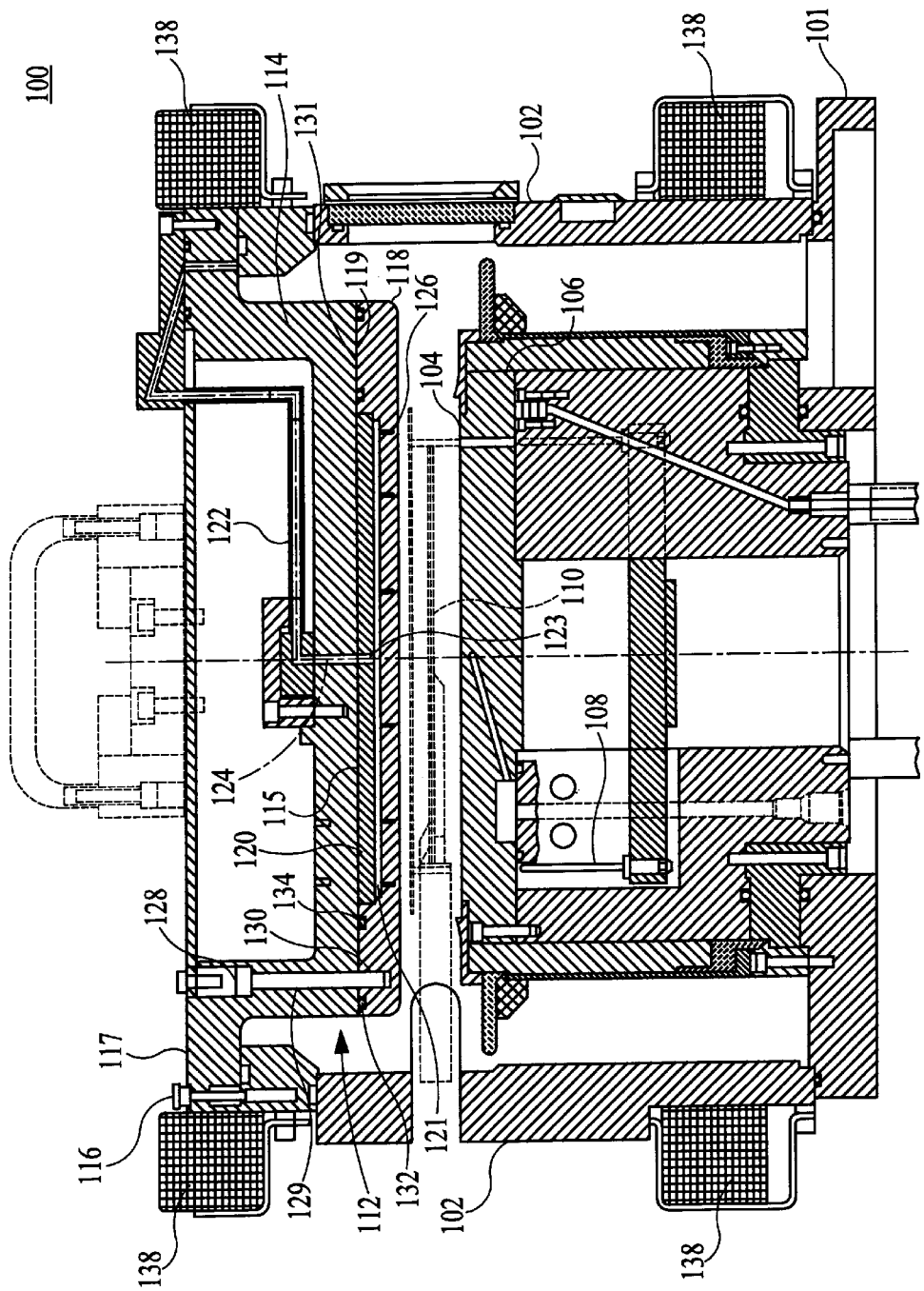
FIG. 1A depicts a cross sectional view of a prior art process chamber.
Figure 1B:
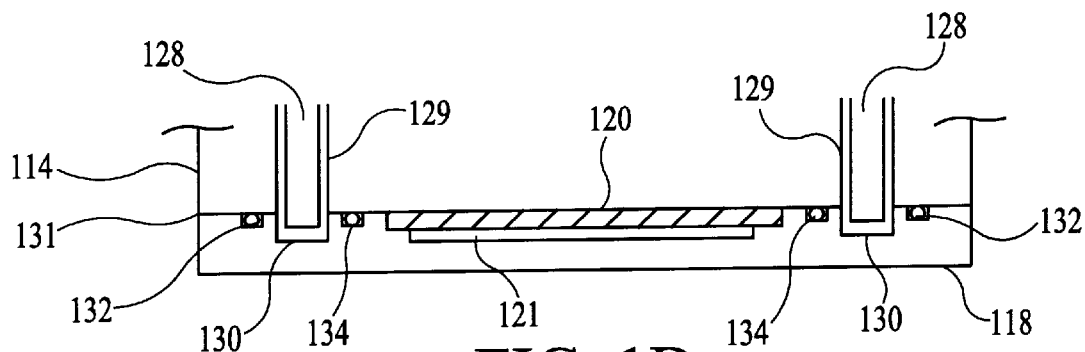
FIGS. 1B and 1C depict close-up cross sectional views of the prior art lid assembly under room temperature and operating temperature conditions.
Figure 1C:
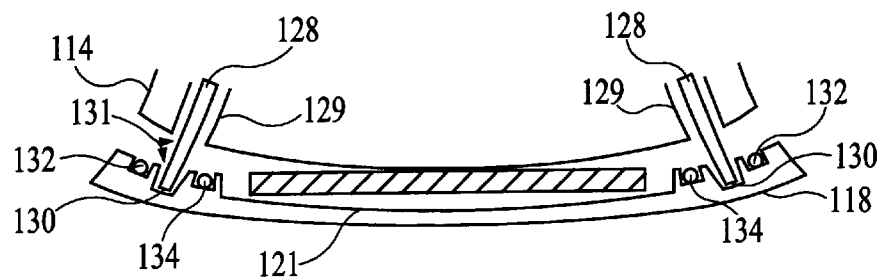
Figure 2:
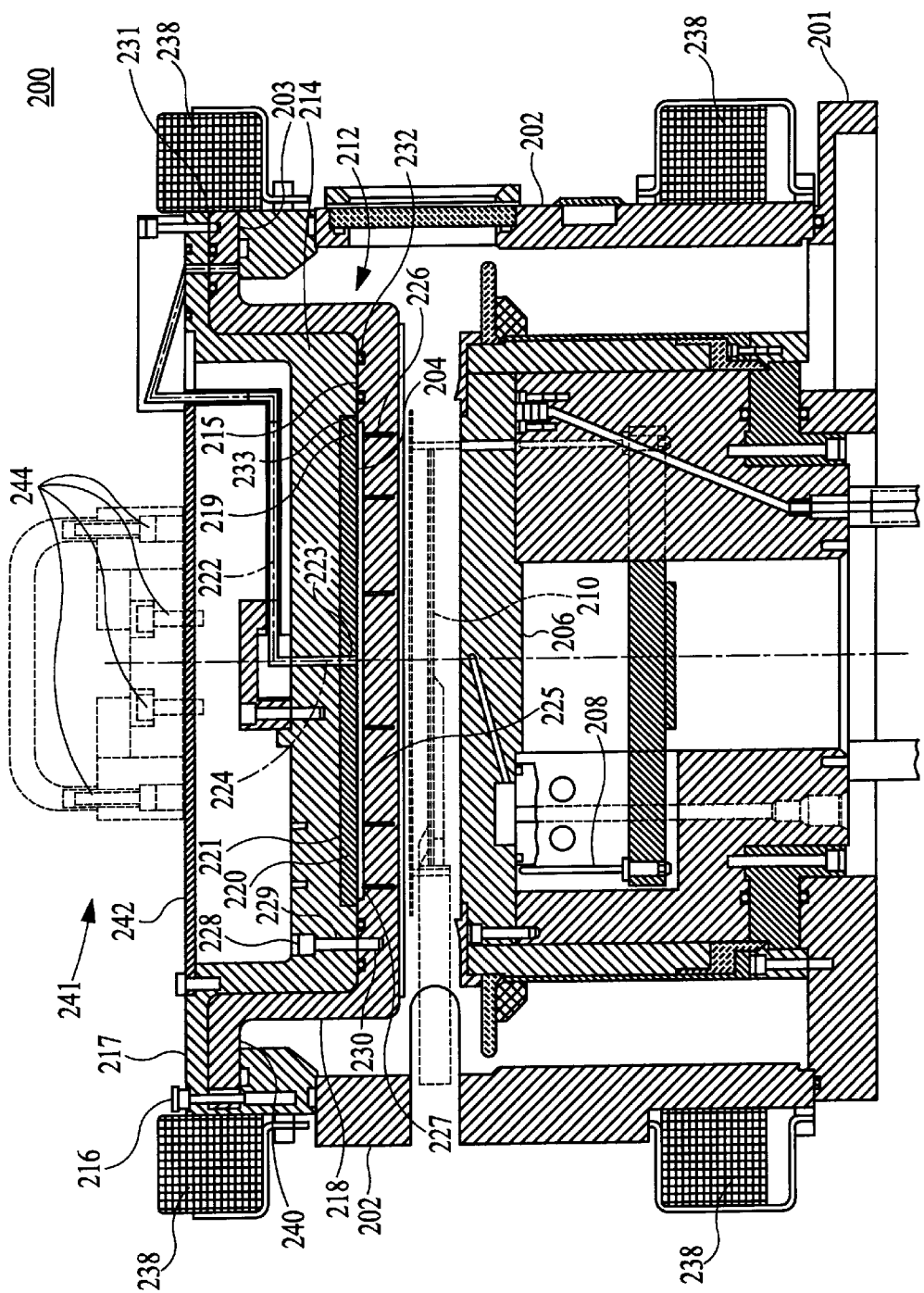
FIG. 2 depicts a cross sectional view of a process chamber of the present invention.

A process chamber 200 with the lid assembly of the present invention is depicted in FIG. 2. The process chamber is used for the one or more steps in the fabrication of IC's on a semiconductor wafer and in a preferred embodiment is a MERIE chamber similar to that described earlier in accordance with FIG. 1. The novel features of the lid assembly of the present invention are best understood by comparing FIG. 1 to FIGS. 2, 3A and 3B. Specifically, the chamber 200 has a set of walls 202 and a base 201. A wafer 104 rests on a pedestal 206 situated inside the chamber 200. Lift pins 208 raise and lower the wafer relative to the pedestal 206. A plurality (e.g., two or four) of magnets 238, mounted outside the chamber 200, provide magnetic fields for confining the plasma. The wafer 104 is introduced into the chamber 200 by a robot arm 210 shown in phantom.

The chamber 200 is covered by a novel lid assembly 212. The lid assembly 212 includes an indented lid 214 that projects into the chamber 200. The lid 214 has a radially projecting circumferential flange 217. A liner 218 has an upper surface 219 that substantially conforms to a lower surface 215 of the lid 214. Both the lid 214 and the liner 218 are substantially U-shaped in cross section. The liner 218 further comprises a radially extending flange 240 that conforms to the flange 217 on the lid 214. As such, the lid assembly 212 is supported by the flange 240 of the liner 218. The lid 214 and the liner 218 are secured to the chamber by bolts 216 that extend through coaxial holes in both flanges 217, 240. A handle 241, secured to the lid, facilitates opening and closing the lid assembly 212. The handle 241, shown in phantom, is attached to a plate 242 that is secured to the lid 214 by a plurality of bolts 244. Furthermore, the lid 214 and the liner 218 join at an interface 231 that extends along the upper surface 219 of the liner 218 and the lower surface 215 of the lid 214 and terminates outside of the chamber 200.

A blocker plate 220 is located in a first recess 221 formed in the lower surface 215 of the lid 214 and ensures even distribution of the flow of gas. The blocker plate is dimensioned slightly smaller than the first recess 221 to snugly fit therein. Preferably, the blocker plate is made of a plastic material such as ULTEM®. ULTEM® is a registered trademark of the General Electric Company of Schenectady, New York. A second recess 227 is formed in the surface 219 of the liner 218. The second recess 227 is slightly smaller than the blocker plate 220. The blocker plate 220 is, therefore, supported by a shelf 233 formed by the upper surface 219 of the liner 218.

Reactive gas is fed into the chamber 200 through a gas feed line 222 which communicates with a passage 224 in the lid 214 and a matching hole 223 in the blocker plate 220 into the second recess 227. Gas flows in the second recess 227 and enters the chamber 200 through a plurality of orifices 226 disposed in the liner 218. Because the interface 231 terminates outside the chamber, only a single leak path exists between the exterior of the chamber and the interior of the chamber. This leak path starts at the flanges 217; 240 and travels along the interface 231 between the lid 214 and the liner 218 into the second recess 227 and through the orifices 226. Only a single O-ring 232, located radially outward from the first recess, is necessary to seal this leak path. Compressive force is exerted on the O-ring 232 by a plurality of bolts 228 that pass through a plurality of clearance holes 229 in the lid 214 and thread into a plurality of matching tapped holes 230 in the liner 218. The holes 229 and 230 are located radially outward of the O-ring 232.

Figure 3A:
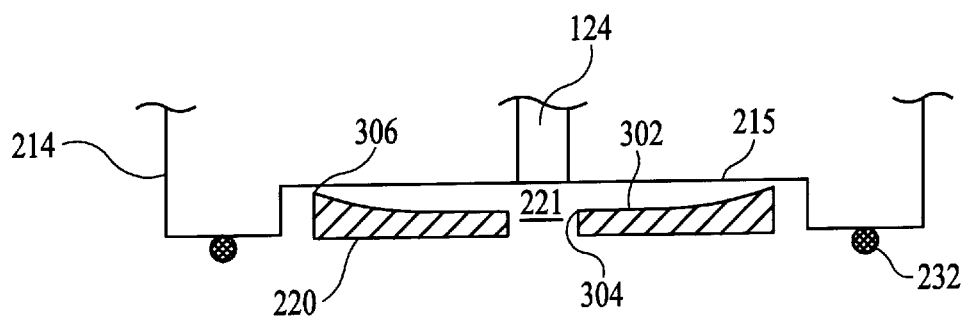
FIGS. 3A and 3B depict close-up cross sectional views of blocker plate of present invention under room temperature and operating temperature conditions.
Figure 3B:
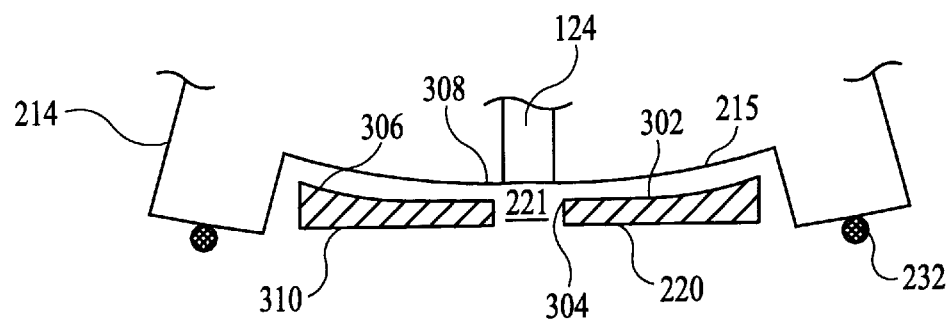

The lid assembly 212 exhibits improved leak resistance compared to lid assemblies of the prior art. Additionally, to alleviate the effect of leaks due to thermal stresses, the blocker plate 220 of the present invention incorporates the novel features depicted in FIGS. 3A and 3B. Specifically, FIGS. 3A and 3B depict close-ups of the blocker plate 220 in the first recess 221. The parts are shown slightly exploded for clarity. The blocker plate 220 has a top surface 302 that is slightly concave. A central portion 304 of the blocker plate 220 is thinner than a peripheral portion 306. The concavity of the blocker plate 220 is greatly exaggerated for the sake of clarity. FIG. 3A depicts the lid 214 and blocker plate 220 at room temperature. The lower surface 215 of the lid 214 is substantially flat. When the chamber is heated to operating temperatures of between 70° C. and 90° C., the lid 214 bows due to thermal stresses such that a central portion 308 (see FIG. 3B) of the lower surface 215 of the lid 214 moves downward. Because of the concave shape of the blocker plate 220, the lower surface 215 of the lid 214 does not exert any stress on the blocker plate that might break the seal formed by the O-ring 232. Instead, the top surface 302 of the blocker plate 220 tends to conform to the downward bow of the lid 214 while a bottom surface 310 of the blocker plate 220 remains substantially flat. Thus, both the function of the blocker plate 220 and the integrity of the seal are maintained under thermal stress.

A chamber fitted with this novel lid assembly is less susceptible to leaks and, consequently, pumps down faster. Furthermore, the lid of the novel lid assembly does not require a wet clean each time the chamber is opened. Instead, the liner 218 can be replaced since the lid 214 is not directly exposed to plasma. That is, for the prior art chamber the lid and the GDP are exposed to the plasma which may contain contaminants. As such, both components must be cleaned before chamber operations can be restarted. By comparison, the liner 218 of the present invention can be cleaned off line without time pressure.

Additionally, the interface 131 requires additional time to outgas or pumpdown. Since the liner of the subject invention improves the vacuum integrity of the chamber, pumpdown time is reduced and only the liner will be subject to atmospheric exposure. Shorter pumpdown times improve particle performance (i.e. the number of contaminant particles formed on the wafer is reduced). Therefore the liner 214 reduces the risk of creating particles that can end up contaminating the wafer reducing the wafer yield. As such, chamber downtime is reduced, wafer throughput and productivity are increased and the number of defective dies per wafer is reduced resulting in a lower cost per wafer. Finally, it is possible to make liners having different depths to accommodate processes requiring different sized gaps.

Although various embodiments which incorporate the teachings of the present invention have been shown and described in detail herein, those skilled in the art can readily devise many other varied embodiments that still incorporate these teachings.

What is claimed is:

1. A lid assembly for a semiconductor processing chamber comprising:
    a lid having a first recess;
    a blocker plate disposed within said first recess; and
    a liner disposed below said lid.

2. The lid assembly as set forth in claim 1, wherein said first recess is formed in a lower surface of said lid.

3. The lid assembly as set forth in claim 2 wherein said blocker plate conforms to said lower surface when said lid assembly is heated.

4. The lid assembly as set forth in claim 3 wherein said blocker plate has a concave upper surface.

5. The lid assembly as set forth in claim 2 further comprising:
    an O-ring, disposed between said lid and said liner, located radially outward of said first recess.

6. The lid assembly as set forth in claim 1 wherein said lid and liner are indented.

7. A lid assembly as set forth in claim 1 where said liner is substantially U-shaped in cross section.

8. The lid assembly as set forth in claim 1 wherein said liner further comprises a second recess in an upper surface and a plurality of openings communicating between said second recess and said chamber.

9. The lid assembly as set forth in claim 8 further comprising at least one opening that communicates between said second recess and a gas source.

10. A semiconductor processing chamber, comprising:
    a set of walls defining a volume;
    a lid, sized to cover said chamber, having a first recess facing said volume;
    a blocker plate disposed within said first recess; and
    a liner disposed below said lid.

11. The semiconductor processing chamber as set forth in claim 10, wherein said first recess is formed in a lower surface of said lid.

12. The semiconductor processing chamber as set forth in claim 10 wherein the blocker plate has a concave upper surface.

13. The semiconductor processing chamber as set forth in claim 10 where said liner is substantially U-shaped in cross section.

14. The semiconductor processing chamber as set forth in claim 10 further comprising an O-ring disposed between said lid and said liner.

15. A semiconductor processing chamber, comprising:
    a base;
    a set of walls extending upwards from said base;
    at least one magnet disposed along said walls for confining a plasma within said chamber;
    a pedestal, disposed within said chamber;
    a U-shaped lid, disposed atop said set of walls thereby defining a volume, the lid further comprising a lower surface facing said volume and a first recess disposed within said lower surface;
    a U-shaped liner disposed below said lid, having an upper surface that substantially conforms to said lower surface of said lid such that an interface between said upper surface and said lower surface terminates outside said semiconductor processing chamber, wherein said liner has a second recess in said upper surface and a plurality of openings communicating between said second recess and said chamber; and
    a blocker plate, having a concave upper surface, disposed in said first recess, that conforms to said lower surface when said lid assembly is heated.

16. The semiconductor processing chamber of claim 15 wherein said chamber is a MERIE chamber.

17. A blocker plate for a lid assembly of a semiconductor processing chamber, comprising:
    a substantially flat lower surface; and
    a contoured upper surface that conforms to a lower surface of said lid assembly when said lid assembly reacts to thermal stress.

18. The blocker plate of claim 17 wherein the contoured upper surface is concave.

* * * * *